United States Patent
Kuan et al.

(10) Patent No.: US 6,625,555 B2
(45) Date of Patent: Sep. 23, 2003

(54) VARIABLE RESISTANCE MEASURING LOOP HAVING COMPENSATIONAL FUNCTION FOR ENVIRONMENTAL FACTORS

(75) Inventors: Yen-Liang Kuan, Taipei (TW); Tsung-Yu Wang, Taipei (TW); Shih-Jen Kuo, Taipei (TW)

(73) Assignee: Behavior Tech Computer Corporation, Taipei (TW)

( * ) Notice: Subject to any disclaimer, the term of this patent is extended or adjusted under 35 U.S.C. 154(b) by 168 days.

(21) Appl. No.: 09/902,164

(22) Filed: Jul. 11, 2001

(65) Prior Publication Data

US 2003/0014202 A1 Jan. 16, 2003

(51) Int. Cl.$^7$ ............................................... G01R 27/00
(52) U.S. Cl. ............................ 702/65; 702/64; 702/107
(58) Field of Search .............................. 702/65, 64, 79, 702/85, 89, 94, 95, 104, 107, 116, 117, 163, 124–126, 150–153, 176, 183, 189, FOR 103–FOR 106, FOR 134, FOR 149, FOR 156, FOR 163, FOR 154, FOR 150, FOR 171; 345/156–158, 161, 173, 163, 168, 174, 178; 178/18.01, 18.02, 18.05; 341/20, 22, 26, 24, 33; 340/870.04, 870.38; 73/1.75, 1.79, 1.81; 324/601, 600; 700/83–85, 302

(56) References Cited

U.S. PATENT DOCUMENTS

| | | | | |
|---|---|---|---|---|
| 5,515,040 A | * | 5/1996 | Lee et al. | 340/870.04 |
| 5,550,329 A | * | 8/1996 | Matsubayashi | 178/18.05 |
| 5,786,808 A | * | 7/1998 | Khoury | 345/161 |
| 6,456,952 B1 | * | 9/2002 | Nathan | 702/94 |

* cited by examiner

Primary Examiner—Hal Wachsman
(74) Attorney, Agent, or Firm—Rosenberg, Klein & Lee

(57) ABSTRACT

A variable resistance measuring loop having a compensational function for environmental factors is provided. The variable resistance measuring loop includes a central processing unit; a variable resistance VR connected between first and second terminals of the central processing unit, as well as a transistor Q and resistance R coupled to respective terminals of the central processing unit, and a capacitor C coupled with the transistor Q to a center contact of the variable resistance VR. During operation, the variable resistance measuring loop establishes at least one of two discharging loop modes wherein discharge of the capacitor C occurs through one of either a resistance portion RA or a resistance portion RB of the variable resistance VR.

2 Claims, 2 Drawing Sheets

VARIABLE RESISTANCE MEASURING LOOP HAVING COMPENSATIONAL FUNCTION FOR ENVIRONMENTAL FACTORS

BACKGROUND OF THE INVENTION (a) Field of the Invention

The present invention relates to a variable resistance measuring loop having a compensation function for environmental factors, and in particular, a measuring loop used in a mouse cursor controller which will not be affected by environmental factors, but will reduce circuit defect rates and upgrade the precision of the mouse cursor controller.

(b) Description of the Prior Art

Among computer peripherals, a computer mouse cursor controller is one of the most indispensable in operating a computer. A computer mouse, keyboard, handwritten board, and joystick are exemplary peripherals which provide the function for controlling the movement of the mouse cursor in controlling and operating the computer in documentation and image handling or in accordance with game software.

Conventionally, the mouse cursor controller hardware is used to control x-axis and y-axis movements on a display. In this controller, an RC charging/discharging circuit calculates the coordinates of movement based on the charging/discharging of a capacitor C. However, due to the influence of the environment, for instance, changes in temperature and humidity, the value of the capacitor C of the RC charging/discharging circuit may be altered. This leads to an unstable circuit, causing the controlling of a mouse or joystick not to be smooth. In a more serious case, equipment may be damaged, such that its calibration cannot be restored to the normal state.

Accordingly, it is an object of the present invention to provide a variable resistance measuring loop having a compensational function for environmental factors, wherein a loop is used in the mouse cursor controller circuit to overcome the above drawbacks.

SUMMARY OF THE INVENTION

Accordingly, it is an object of the present invention to provide a variable resistance measuring loop having a compensation function for environmental factors, wherein two ends of a variable resistance connected to a control loop which is connected to a capacitor charging/discharging device are employed. The amount of movement is calculated via a discharging equation, and due to the two ends of the variable resistance being connected accordingly, the measuring loop is not affected by environmental factors in the mouse cursor controller circuit.

Yet another object of the present invention is to provide a variable resistance measuring loop having a compensation function for environmental factors wherein a central processing unit, CPU, has a first terminal thereof connected to one end of the variable resistance and a second terminal thereof connected to the other end, a center contact of the variable resistance being connected to a collector of a charging switch transistor Q. The base of the transistor Q is connected in series with a resistance R to a third terminal of the CPU; the emitter of the transistor Q is connected to a VDD power source; and, the drain is coupled to a fourth terminal of the CPU, and connected in series with a charging/discharging capacitor C to common ground. By means of the two ends of the variable resistance being connected to a control loop which is connected to a capacitor charging/discharging device, the amount of cursor movement is calculated via a discharging formula. Additionally, the measuring loop is not affected by environmental factors bearing upon the mouse cursor controller circuit.

DETAILED DESCRIPTION OF THE PRESENT INVENTION

Figure 1:
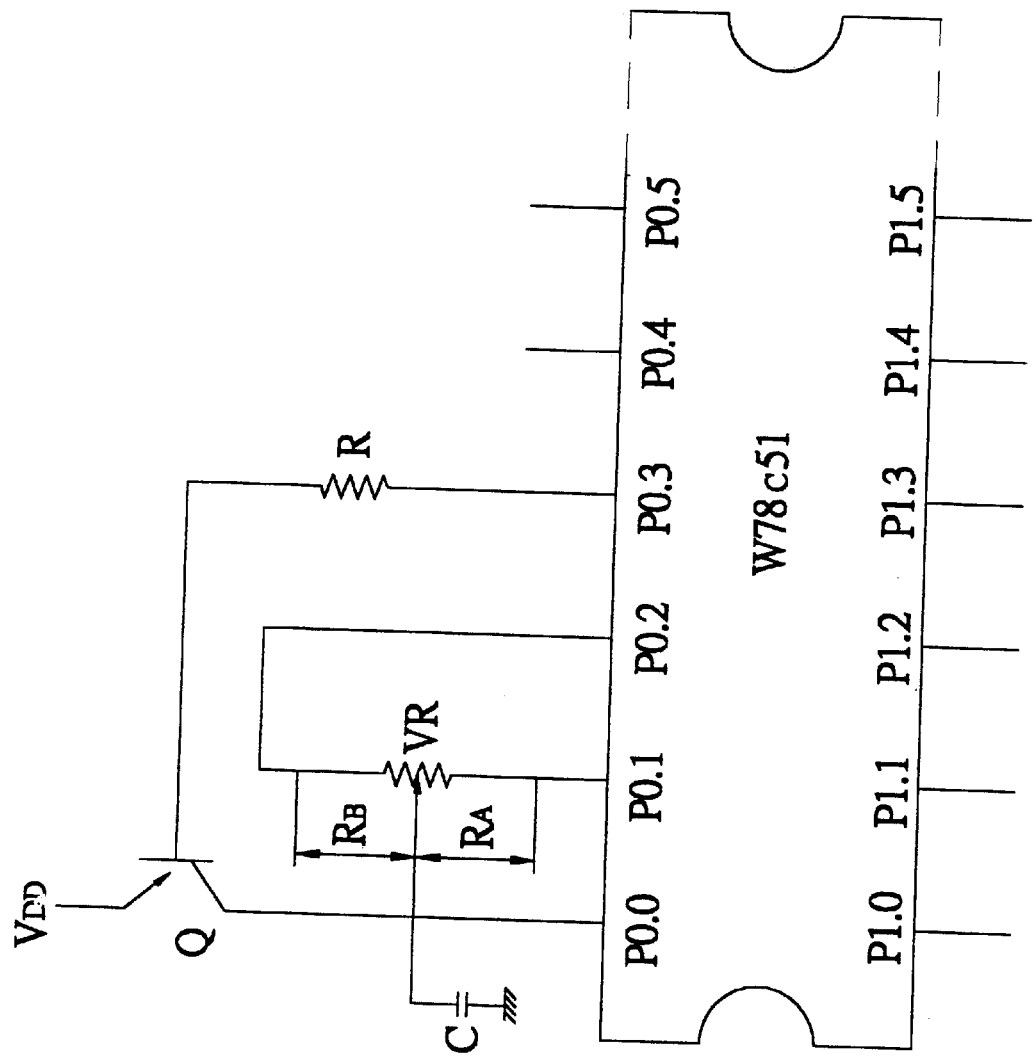
FIG. 1 is a circuit diagram of the present invention.

Referring to FIG. 1, there is shown a variable resistance measuring loop having a compensation function for environmental factors comprising a central processing unit CPU, a discharging resistance VR, a charging capacitor C, a transistor Q used as a charging switch, and a base resistor R for current control.

In accordance with the present invention, the CPU is preferably INTEL 80c51 compatible, for instance, a WINBOND w78c51 device, wherein the electrical properties are similar to that of the INTEL 80c51. One end of the variable resistance is connected to a first terminal, PO.1 of the CPU, the other end is connected to a second terminal, PO.2, thereof. A center contact of the variable resistance is connected to a collector of a charging switch transistor Q whose base is connected by a resistance R to a third terminal, PO.3, of the CPU, whose emitter is connected to a VDD power source. The collector is coupled to a fourth terminal, PO.0, of the CPU, and to a charging/discharging capacitor C extending to common ground.

In accordance with the present invention, the working principles are as follows:

(1) Charging loop:
  Terminals PO.0, PO.1, PO.2 of the CPU are configured for input, and the terminal PO.3 is configured for output, while the output is set to a LOW state. At this point, current from VDD flows via the transistor Q to charge the capacitor. The transistor Q is triggered to saturation, the saturated voltage equaling the power source voltage VDD minus the saturated voltage VCE of the transistor.

Figure 2:
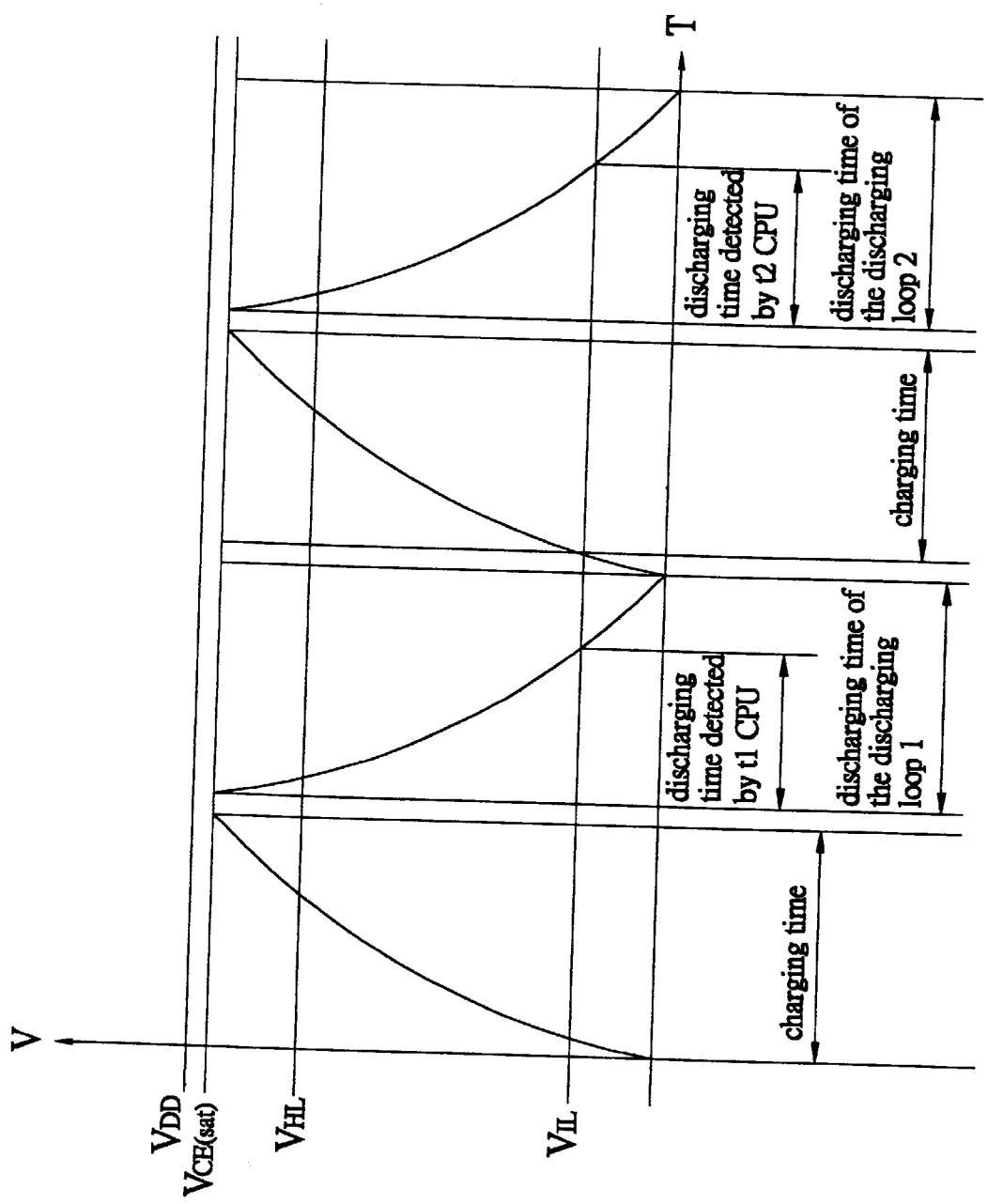
FIG. 2 is a charging/discharging waveform diagram of the present invention.

(2) Discharging loop:
  Terminals PO.0, PO.2, PO.3 of the CPU are configured for input, and PO.1 is configured for output, while the output itself is set to a LOW state. At this point, the transistor Q is cut off, and the capacitor C charging current flows through resistor $R_A$ to terminal PO.1. Terminal PO.1 detects the variation of discharging voltage, and the discharging is completed after a period of time. The discharging waveforms are shown in FIG. 2.

(2.2) Discharging loop (2):
    Terminals PO.0, PO.1 and PO.3 of the CPU are configured for input, and terminal PO.2 is configured for output, while the output itself is set to a LOW state. At this point, the transistor Q is cut off, and the capacitor C charging current flows through $R_B$ to terminal PO.2. Terminal PO.0 detects the variation of discharging voltage, and charging is completed after a period of time. The discharging waveforms are shown in FIG. 2.

As reflected in the figure, the discharging equation is as follows:

(1) Discharging equation

Voltage for capacitor $V_C =$ $$V_{DD} \cdot e^{\frac{t}{RC}} \Rightarrow e^{\frac{t}{RC}} = \frac{V_C}{V_{DD}} \Rightarrow l_n e^{\frac{t}{RC}} = l_n \frac{V_C}{V_{DD}} \Rightarrow -\frac{t}{RC} = l_n \frac{V_C}{V_{DD}} \Rightarrow t =$$

$$-RCl_n \frac{V_C}{V_{DD}} \Rightarrow t = RCl_n \frac{V_{DD}}{V_C} \Rightarrow t = RCl_n \frac{V_{DD} - V_{CE(sat)}}{VIL}$$

$$t_A = \frac{t_1}{t_1 + t_2} = \frac{R_A \cdot Cl_n V_{DD} - \frac{V_{CE(sat)}}{VIL}}{R_A \cdot Cl_n V_{DD} - \frac{V_{CE9sat)}}{VIL} + R_B \cdot Cl_n V_{DD} - \frac{V_{CE(sat)}}{VIL}} = \frac{R_A}{R_A + R_B}$$

$$t_B = \frac{t_2}{t_1 + t_2} = \frac{R_B \cdot Cl_n V_{DD} - \frac{V_{CE(sat)}}{VIL}}{R_A \cdot Cl_n V_{DD} - \frac{V_{CE(sat)}}{VIL} + R_B \cdot Cl_n V_{DD} - \frac{V_{CE(sat)}}{VIL}} = \frac{R_B}{R_A + R_B}$$

applying (1) Joystick $= \frac{R_A}{R_A + R_B} \times$ Max. output = Joystick Report (2) Mouse $= \frac{R_A}{R_A + R_B} \times 255 \rightarrow 0 \sim 255$ $\Rightarrow$ Mouse movement $-128 \sim +127$ $R_A + R_B = V_R$ $R_A : 0 \sim V_R$ $R_B : 0 \sim V_R$ In accordance with the present invention, two ends of the variable resistance are connected to a control loop wherein a capacitor charging/discharging is employed, and the amount of cursor movement is calculated in accordance with a discharging formula. Due to the two ends of the variable resistance being so connected, the measuring loop is not affected by environmental factors present in the given application of the mouse cursor controller circuit.

While the invention has been described with respect to preferred embodiments, it will be clear to those skilled in the art that modifications and improvements may be made to the invention without departing from the spirit and scope of the invention. Therefore, the invention is not to be limited by the specific illustrative embodiment, but only by the scope of the appended Claims.

What is claimed is:

1. A variable resistance measuring loop having a compensational function for environmental factors comprising:
   a central processing unit CPU;
   a variable resistance VR having a first end connected to a first terminal PO.1 of the CPU, a second end connected to a second terminal PO.2 thereof, and a center contact connected to a collector of a charging switch transistor Q, a resistance R being connected between a base of the transistor Q and a third terminal PO.3 of the CPU, an emitter of the transistor Q being connected to a VDD power source, the collector being coupled to a fourth terminal PO.0 and by a charging/discharging capacitor C to common ground, wherein a charging loop is formed by the terminals PO.0, PO.1, PO.2 of the CPU being configured for input, the terminal PO.3 being configured for output, and an output being set to a LOW state, whereby current flows from the VDD power source via the transistor Q to charge the capacitor C, the transistor Q being driven to saturation, wherein a saturation voltage equals the power source voltage VDD minus a saturated voltage VCE of the transistor, and a discharging loop being formed in accordance with at least one of first and second discharging loop modes:
      the first discharging loop mode including the terminals PO.0, PO.2, PO.3 of the CPU being configured for input, the terminal PO.1 being configured for output, and an output being set to a LOW state, whereby the transistor Q is cut off, and current flows from the capacitor C through a resistance portion RA of the variable resistance VR to the terminal PO.1, variation of discharging voltage being detected at terminal PO.1, the discharging being completed over a period of time;
      the second discharging loop mode including the terminals PO.0, PO.1 and PO.3 of the CPU being configured for input, the terminal PO.2 being configured for output, and the output being set to a LOW state, whereby the transistor Q is cut off, and current flows from the capacitor C through a resistance portion RB of the variable resistance VR to the terminal PO.2, variation of the discharging voltage being detected at terminal PO.0, the discharging being completed over a period of time;
      the two ends of the variable resistance VR being thereby connected to a control loop having capacitor charging/discharging, the amount of movement of a cursor being calculated responsive to a discharging of the capacitor C, whereby the variable resistance measuring loop is compensated for environmental factors in a mouse cursor controller circuit.

2. The variable resistance measuring loop of claim 1, wherein the discharging of the capacitor C is characterized by:

$$V_C = V_{DD} \cdot e^{\frac{t}{RC}} \Rightarrow e^{\frac{t}{RC}} = \frac{V_C}{V_{DD}}; \Rightarrow l_n e^{\frac{t}{RC}} = l_n \frac{V_C}{V_{DD}} \Rightarrow -\frac{t}{RC} =$$

$$l_n \frac{V_C}{V_{DD}} \Rightarrow t = -RCl_n \frac{V_C}{V_{DD}} \Rightarrow t = RCl_n \frac{V_{DD}}{V_C} \Rightarrow t = RCl_n \frac{V_{DD} - V_{CE(sat)}}{VIL}$$

where C represents the capacitance of the capacitor C, $V_c$ represents a voltage across the capacitor C, t represents a characteristic time constant, R represents the effective resistance coupled to the capacitor C, and VIL represents a predetermined voltage threshold; such that:

$$t_A = \frac{t_1}{t_1 + t_2} = \frac{R_B \cdot Cl_n \frac{V_{DD} - V_{ce(sat)}}{VIL}}{R_A \cdot Cl_n \frac{V_{DD} - V_{CE(sat)}}{VIL} + R_B \cdot Cl_n \frac{V_{DD} - V_{CE(sat)}}{VIL}} = \frac{R_B}{R_A + R_B}$$

$$t_B = \frac{t_2}{t_1 + t_2} = \frac{R_B \cdot Cl_n \frac{V_{DD} - V_{CE(sat)}}{VIL}}{R_A \cdot Cl_n \frac{V_{DD} - V_{CE(sat)}}{VIL} + R_B \cdot Cl_n \frac{V_{DD} - V_{CE(sat)}}{VIL}} = \frac{R_A}{R_A + R_B}$$

where $t_A$ represents an effective time constant for the first discharging loop, $t_B$ represents an effective time constant for the second discharging loop, $t_1$ represents a time constant factor corresponding to the resistance portion RA, and $t_2$ represents a time constant factor corresponding to the resistance portion RB;

whereby a joystick report for an input device is defined by:

$$\frac{R_A}{R_A + R_B} \times \text{a maximum output parameter of the input device;}$$

and, a mouse cursor movement in an exemplary case of the maximum output parameter equaling 255 is illustratively defined by:

$$\frac{R_A}{R_A + R_B} \times 255 \to 0 \sim 255$$

the mouse cursor movement being within the range between −128~+127, where:

$R_A + R_B = V_R$ $R_A : 0 \sim V_R$ $R_B : 0 \sim V_R$.

* * * * *